United States Patent [19]

Borchelt et al.

[11] Patent Number: 5,337,026
[45] Date of Patent: Aug. 9, 1994

[54] SAW DEVICE AND METHOD OF MANUFACTURING

[75] Inventors: Earl F. Borchelt, Cambridge; Thomas E. Parker, Framingham, both of Mass.

[73] Assignee: Raytheon Company, Lexington, Mass.

[21] Appl. No.: 727,967

[22] Filed: Apr. 26, 1985

Related U.S. Application Data

[62] Division of Ser. No. 650,017, Sep. 13, 1984.

[51] Int. Cl.$^5$ .............................. H03H 9/00
[52] U.S. Cl. .................. 333/150; 310/313 R
[58] Field of Search ................. 333/150-155, 333/194; 310/313 R, 313 A, 313 B, 313 C

[56] References Cited

U.S. PATENT DOCUMENTS

| | | | |
|---|---|---|---|
| 3,872,331 | 3/1975 | Falco | 333/150 X |
| 4,270,105 | 5/1981 | Parker et al. | 333/155 |
| 4,296,347 | 10/1981 | Weirauch | 310/313 R X |

Primary Examiner—Mark Hellner
Attorney, Agent, or Firm—Richard M. Sharkansky

[57] ABSTRACT

A pair of crystallographically matched piezoelectric substrates are sealed together to provide a package for a SAW device. A sealant material including a glass frit is deposited on a selected portion of a first one of the pair of substrates. The substrate having the sealant material is then heated to a temperature which is substantially below the glazing temperature of the sealant material to dry the sealant material. The substrate having the dried sealant material is heated a second time at a temperature just above the softening temperature of the glass frit to glaze the glass frit component with other components of the sealant material being driven from the glass frit during the heating cycles. The substrate having the glazed frit and the other remaining substrate are then mated together in a predetermined manner. While the substrates are held together by exerting a downward pressure on the two mated substrates, the mated substrates are heated in a vacuum to a temperature substantially above the softening temperature of the sealant material, but below the crystallographic transformation temperature of the material of the substrates. This last heating cycle is used to seal the mated pair of substrates and to provide the packaged SAW device.

20 Claims, 10 Drawing Sheets

SAW DEVICE AND METHOD OF MANUFACTURING

CROSS-REFERENCE TO RELATED APPLICATIONS

This is a division of application Ser. No. 650,017, still pending, filed Sep. 13, 1984.

BACKGROUND OF THE INVENTION

This invention relates generally to surface acoustic wave devices and more particularly to surface acoustic wave device packages.

As is known in the art, surface acoustic wave devices (SAW devices) are used in a variety of applications such as resonators and delay lines for oscillator circuits, as well as, filters and pressure transducers. Generally, a SAW device comprises at least one transducer including a set of conductive members which is disposed on, or recessed within the upper surface of, a piezoelectric substrate. In many applications for SAW devices, particularly with respect to applications involving oscillators, it is important to provide a package having a relatively small size, while at the same time, properly mounting the SAW device within the package to reduce the so-called vibration sensitivity of the SAW device. It is known that the resonant frequency of an oscillator including a SAW device is sensitive to external vibration or the changes in external stresses applied to the SAW device. This sensitivity results from the external stress on the piezoelectric substrate causing changes in surface wave velocity and hence resonant frequency. Conventional packages, such as TO-8 packages and flat packs while being hermetically sealed, are relatively large in comparison to the size of the SAW device. Such packages also constrain how the SAW device substrate can be mounted within the package to provide a SAW device having a surface wave velocity which is relatively invariant with external stress.

It is generally known that the lowest vibration sensitivity is obtained when the bottom of the SAW device substrate is uniformly supported. One approach is to provide a soft, stress damping material such as a rubber or room temperature vulcanizing silicone rubber (RTV) on the conventional package to uniformly support the bottom of the SAW device substrate. It has been found, however, that such a soft material causes long term frequency shifts in SAW devices provided within such packages because over time the soft material will outgas impurities which may become deposited upon the upper surface of the SAW device substrate. These deposited impurities are believed to cause changes in the velocity of the surface waves which propagate along the upper surface of the substrate and hence changes in the long term frequency characteristics of the device. These frequency characteristic changes often are of a magnitude equal to or greater than the changes caused by the very vibration effects that the soft material was to suppress. On the other hand, rigidly fastening the bottom of the substrate to the package may also be unacceptable since the thermal expansion characteristics of the SAW substrate are generally not perfectly matched to the thermal expansion characteristics of the material of the package. Because of the mismatch in thermal expansion characteristics, this arrangement leads to unpredictable temperature dependent stress characteristics that adversely affect frequency stability and may even result in fracture of the package.

One solution to this problem has been to provide a hermetically sealed package in which the SAW substrate provides a portion of the package. Such arrangements are shown in U.S. Pat. No. 4,270,105, Parker et al, issued May 26, 1981, entitled "Stabilized Surface Wave Device," and assigned to the same assignee as the present invention, and articles entitled "Long Term Aging and Mechanical Stability of 1.4 GHz SAW Oscillators," by M. Gilden et al, Proceedings of the IEEE, Ultrasonic Symposium, 1980, pp. 184; and "SAW Resonator Frit Bonded Pressure Transducer," by D. Weirauch et al, Proceedings of the IEEE, Ultrasonic Symposium, 1979, pp. 874. The issued U.S. patent describes an all quartz package having a hydrophonic polymer coating for passivating the upper surface of the substrate on which the surface waves propagate. The article by Gilden et al describes a SAW based oscillator including a quartz packaged SAW device. Long term aging data indicates that such devices will have a frequency shift of at least ±4 ppm per year. For some applications of stable oscillators, this drift or aging characteristic is unacceptable. The second article by Weirauch describes a pressure transducer fabricated having an all-quartz package. According to this article, a frit was applied to both substrates and the substrates were then mated together. As indicated in this article, a time dependent short term change causing a hysteresis effect was present. This indicates that there may be some noise problem associated with this technique. It was also suggested that some long-term effects may be present. These short term and potential long term drift problems may be unacceptable for SAW devices such as delay lines and resonators when used in highly stable precision oscillators.

SUMMARY OF THE INVENTION

In accordance with the present invention, a pair of crystallographically matched piezoelectric substrates are sealed together to provide a package for a SAW device. A sealant material including a glass frit and organic binder vehicle is deposited on a selected portion of a first one of the pair of substrates. The substrate having the sealant material is then heated to a temperature which is substantially below the glazing temperature of the glass frit component of the sealant material to drive off the binder vehicle of the sealant material leaving disposed on said substrate the glass frit. The substrate having the dried glass frit is heated a second time at a temperature just above the softening temperature of the glass frit component to drive off any remaining binder vehicle component and to glaze the glass frit. The substrate having the glazed glass frit and the other remaining substrate are then mated together in a predetermined manner. While the substrates are held together by exerting a force on the two mated substrates, the mated substrates are placed in an evacuated chamber and heated at a temperature substantially above the softening temperature of the glass frit, but below the crystallographic transformation temperature of the material of the substrates. This last heating cycle is used to seal the mated pair of substrates and to provide the packaged SAW device. With such an arrangement, a hermetic seal between the pair of crystallographically matched piezoelectric substrates is provided. The packaged SAW device may then be shock mounted on a soft, stress damping material such as rubber or an RTV silicone rubber and then the shock mounted SAW device may be mounted in a second package to provide a packaged SAW device having a relatively low vibration sensitivity. This arrangement overcomes the problems associated with out-gassing of impurities from the soft material, since the SAW device package is hermetically sealed. The glass frit providing the seal also provides a space between the pair of crystalline substrates such that surface wave propagation over the surface which supports surface wave propagation is uneffected by the glass frit seal or the second cover substrate.

In accordance with an additional aspect of the present invention, the packaged SAW device, comprising the pair of sealed crystal substrates, one of which is mounted on the stress damping material, is used as a delay element in a stable oscillator. The outer exposed surface of the second one of the substrates provides a base for mounting thereon an integrated circuit comprising the remaining circuits of the oscillator for providing, in combination with the SAW device, a stable oscillator. With this arrangement, a very small, compact and relatively inexpensive stable oscillator is provided.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
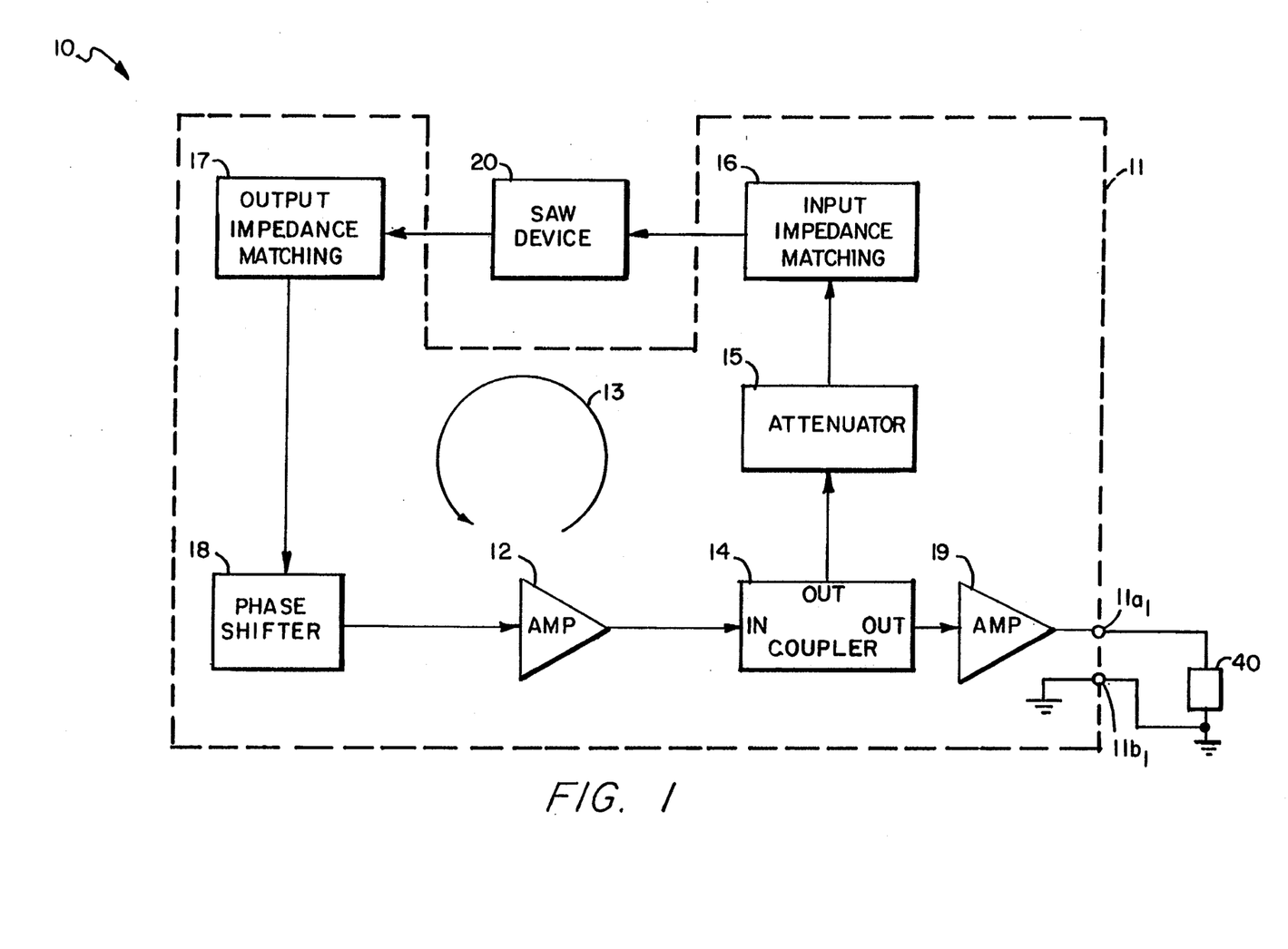
FIG. 1 is a block diagram showing a SAW device used as a delay element in an oscillator circuit.

Referring now to FIG. 1, an oscillator circuit 10 is shown to include an amplifier 12 and a feedback loop denoted by an arrow 13 coupled between input and output ports of amplifier 12. The feedback loop 13 includes coupling means 14, attenuator 15, input impedance matching network 16, a SAW device 20, an output impedance matching network 17, and a phase shifter 18. The SAW device 20, here a resonator 21a (FIG. 3A), is used in the feedback loop 13 to stabilize the phase and frequency characteristics of the signal in the feedback loop 13. The output of amplifier 12 is coupled to here the input port of the coupling means 14. The coupling means 14 is here a microstrip type directional coupler although a center tapped transformer may alternatively be used. A first branch output port of coupler 14 is coupled to the attenuator circuit 15. A second branch port, here an output port of the coupling means 14, is coupled to a second amplifier 19, here a conventional amplifier used to provide an amplified output signal to output terminals $11a_1$, $11b_1$. The coupling means 14 is thus used to divide the output signal provided from amplifier 12, and to feed a first portion of the signal to a conventional attenuator 15 and a second portion of the signal to the output amplifier 19 in a predetermined ratio. A ratio of 10:1 is typically used so that 1 part in 10 of the signal is fed to the input of the output amplifier 19 and the remaining portion of the signal is coupled to attenuator 15 and is fed back to amplifier 12, via the remaining portion of the feedback loop 13. The output amplifier 19 is used to provide an amplified output signal in response to the signal generated by the oscillator circuit 10, and to feed such amplified output signal to output terminals $11a_1$, $11b_1$, and hence to a load 40. The frequency of the output signal which is fed to the amplifier 19 is selected in accordance with the phase and frequency characteristics of an input signal fed back to the input of amplifier 12. The phase and frequency characteristics of the input signal are, in turn, controlled by the phase and frequency characteristics of the SAW device 20, phase shifter 18, and the other components of the feedback loop 13, as is known in the art. The attenuator circuit 15 may optionally be required to control the signal level in the feedback loop of the oscillator. Also, depending upon the characteristics of the various circuits, conventional input and output impedance matching networks 16 and 17 are optionally used to match the impedances in the feedback loop to the impedances of the SAW device 20. Such impedance matching circuits 16, 17 and attenuator circuit 15, however, are not always required.

The SAW device 20 when fabricated as a SAW resonator 21a (FIG. 3A) in combination with the phase shifter 18 provides a fixed and adjustable phase shift to the input of the amplifier 12 thereby supplying the requisite phase shift characteristic to the input of amplifier 12. As is known in the art, by providing the input signal to the amplifier 12 with the requisite phase shift ($\emptyset = 0°$) at the resonant frequency, oscillations will be supported within the oscillator circuit 10. The major portion of the phase shift in the feedback loop 13 is provided by the resonator 21a (FIG. 3A), with the phase shifter 18 providing a relatively small adjustment in the phase characteristic of the feedback loop 13 thus enabling fine tuning of the resonant frequency of the oscillator 10 over a predetermined bandwidth. Since the SAW resonator 21a provides a substantially complete and relatively stable portion of the delay around the feedback loop, the frequency of oscillations from the oscillator will be likewise relatively stable.

Figure 4:
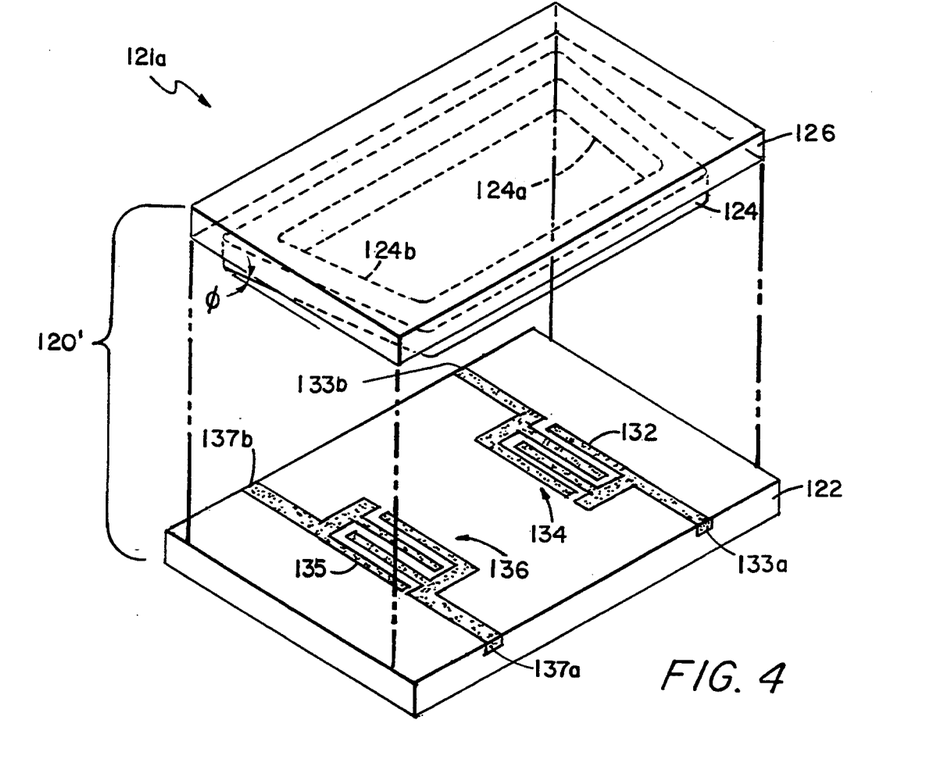
FIG. 4 is an exploded isometric view of a SAW device package having a base substrate configured to provide a SAW delay line, and including a cover, as shown in FIG. 2B, and a patterned sealant material disposed on a first surface of the cover in accordance with the present invention.

In other applications of the SAW device 20 as a delay element 20 in the feedback loop of an oscillator 10, for example, the SAW device 20 may be fabricated as a SAW delay line 21b (FIG. 4). The SAW delay line 21b and the phase shifter 18 are also used to provide a fixed and adjustable phase shift characteristic around the feedback loop 13 as described above.

Figure 5:
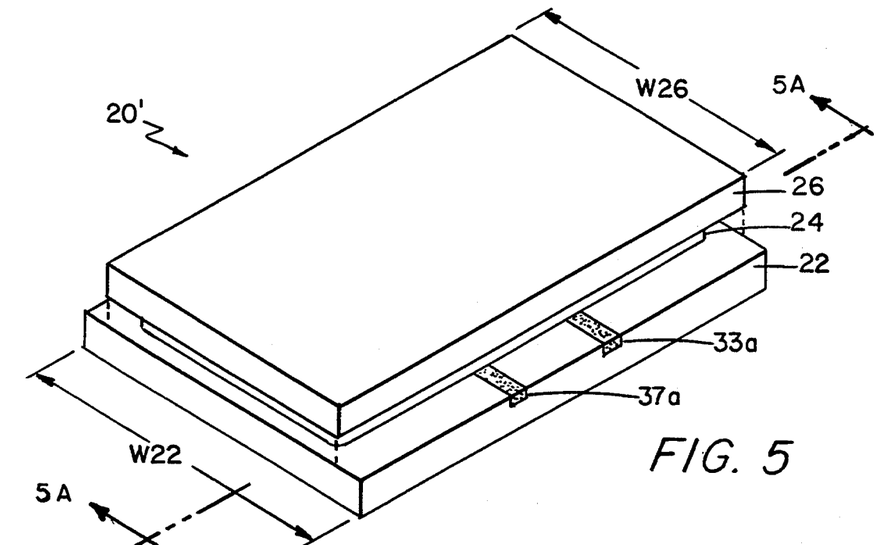
FIG. 5 is an isometric view of the sealed quartz package for the SAW device of FIG. 3A.

In a preferred embodiment, the electrical amplifier 12, coupling means 14 and, as required, the attenuator 15, input impedance matching network 16, output impedance matching network 17, phase shifter 18 and output amplifier 19 are fabricated as a monolithic integrated circuit, denoted here and in FIG. 5, as 11 and 11', respectively.

Fabrication of package 20' for the SAW resonator 21a (FIG. 3A) will now be described in conjunction with FIGS. 2-9.

Figure 3A:
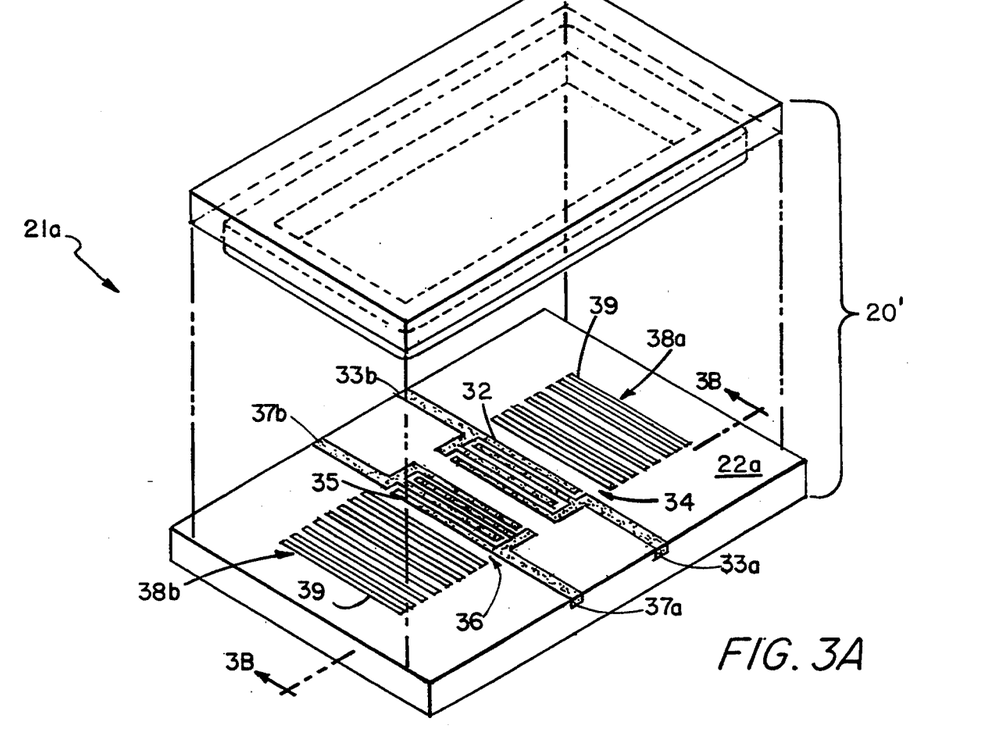
FIG. 3A is an exploded isometric view of a SAW device package having a base substrate configured to provide a SAW resonator, and including a cover, as shown in FIG. 2, and a patterned sealant material disposed on a first surface of the cover in accordance with the present invention.

Referring first to FIG. 3A, the SAW resonator 21a is shown to include a substrate cover 26, base substrate 22 and a glass frit seal 24 disposed therebetween.

Referring now to FIG. 2, a substrate cover 26, here comprised of ST-cut quartz, is shown to include a screen printed pattern 52 having disposed therein a sealant material 23, here said sealant material 23 being comprised of a mixture of a glass frit powder and an organic binder vehicle. Said screen printed pattern 52 and sealant material 23 are provided in a manner to be described.

Here the glass frit used is a high lead oxide content glass frit. Examples of two of such frits suitable for use with ST-cut quartz are Corning Glass Works, Corning, N.Y., No. 8463 vitrifying frit, and Corning No. 7572 devitrifying frit, hereinafter referred to as "8463" and "7572," respectively. However, any suitable glass frit having a thermal expansion coefficient substantially matched to the thermal expansion coefficient of the selected material of the substrate cover and base member and having a firing temperature below the crystallographic transformation temperature of the material or the substrate may also be used. The organic binder vehicle here used is a mixture of 60 ml butyl carbitol acetate, 40 ml butyl carbitol and 3 g of an acrylic resin, more particularly, an isobutyl methyl methacrylate resin, here obtained from Dupont Company, Special Products Division, Methyl Methacrylate Products Group, Wilmington, Delaware under the tradename Elvacite "2045." Amyl acetate alone was tried as an organic binder vehicle. However, amyl acetate dried too quickly and the results were less acceptable. Thus, it was found that the best results were obtained using a binder vehicle which dried relatively slowly allowing sufficient time for the glass frit material to flow prior to the organic vehicle being driven off.

Figure 2A:
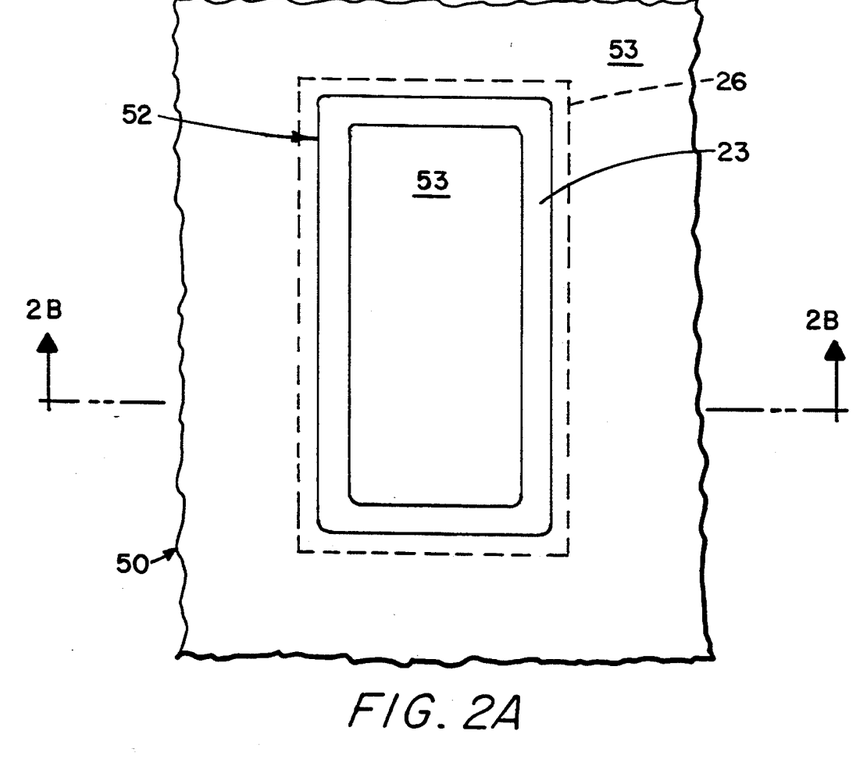
FIG. 2A is a plan view of a cover portion of a package for a SAW resonator having on a first surface of said cover a patterned glass frit sealant material.
Figure 2B:
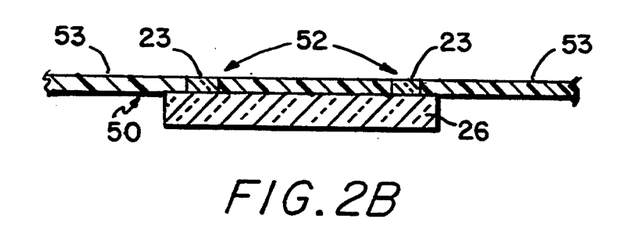
FIG. 2B is a cross-sectional view of the package cover shown in FIG. 2A taken along lines 2B-2B of FIG. 2A.
Figure 2C:
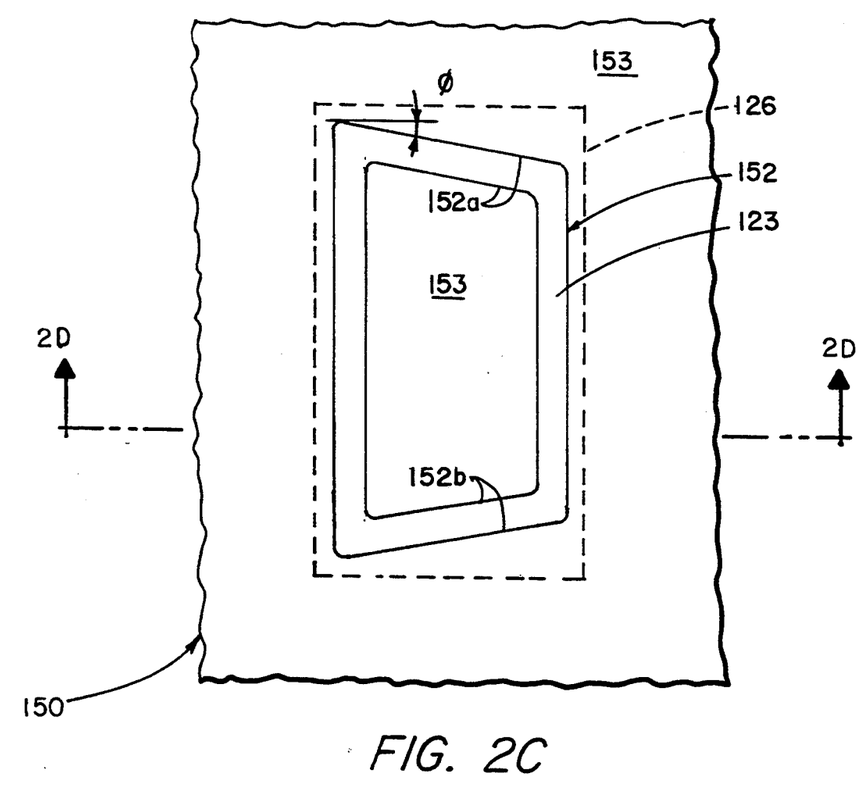
FIG. 2C is a plan view of a cover portion of a package for a SAW delay line having on a first surface of said cover a patterned glass frit sealant material having slanted edges in accordance with an additional aspect of the present invention.
Figure 2D:
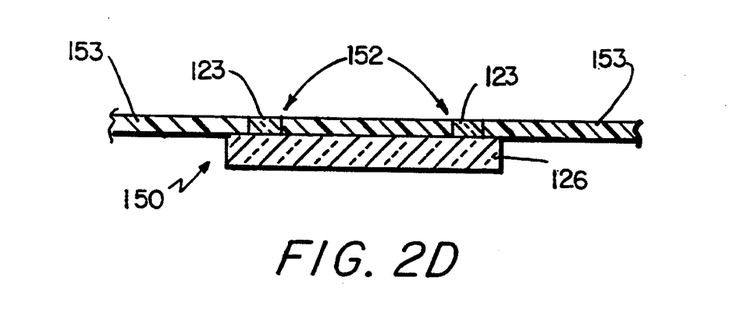
FIG. 2D is a cross-sectional view of the package cover shown in FIG. 2C taken along lines 2D-2D of FIG. 2C.

As was previously mentioned above, the sealant material 23 is screen printed onto here the substrate cover 26 of the package 20' (FIG. 3A). The sealant material 23 is screen printed as follows: A fine mesh stainless steel screen 50 is provided with an emulsion film layer 53 in a conventional manner. The pattern 52, here in the form of a rectangular ring pattern, is projected on the emulsion film 50. The area of the ring pattern 52 is exposed while the remaining portion of the layer 53 is unexposed. The exposed portion of layer 53 is developed and then dissolved away while the unexposed portion of layer 53 remains in situ on the screen 50, thus providing the patterned area 52. The patterned screen 50 is then disposed over the substrate cover 26. The sealant material 23 is then provided over the screen 50 and fills the pattern 52. Excess amounts of the sealant material on the screen 50 are removed by any suitable means, such as by use of a "squeegee." Remaining on the substrate 26 in the patterned area 52, however, is the sealant material 23. Preferably, the pattern 52 is provided over a peripheral surface portion of the substrate 26 adjacent to the edges of said substrate cover 26, as shown in FIGS. 2 and 2A. The sealant material 23 provides a continuous closed path or ring pattern on the surface of substrate cover 26. The sealant material 23 on the substrate cover 26 is processed in a manner to be described, to provide a glass frit seal 24 between the substrate cover 26 and a base member 22 of the package (FIG. 3A).

After the sealant material 23 has been deposited in the unpatterned areas of the fine mesh screen 50, the fine mesh screen 50 is removed from the surface of the substrate cover 26. The substrate cover 26 having thereon the patterned sealant material is then baked in an oven at a temperature substantially below the glazing temperature of the glass frit. Here a temperature of 140° is used, said temperature being selected to dry out the sealant material, that is, to drive off from the sealant, the organic binder vehicle component thereof without glazing the glass frit component. Here the substrate cover 26 is baked at 140° C. in air for approximately 1 hour.

Figure 8A:
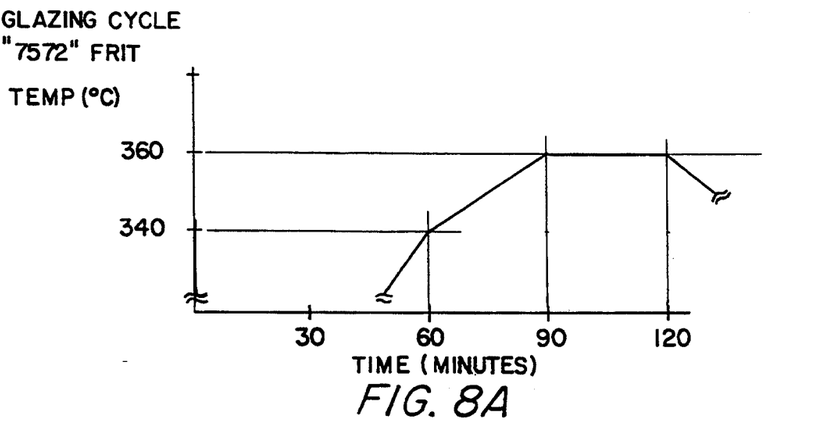
FIGS. 8A, 8B are graphs of temperature vs. time for a heating cycle to glaze and a heating cycle to seal the package with a devitrifying frit.
Figure 9A:
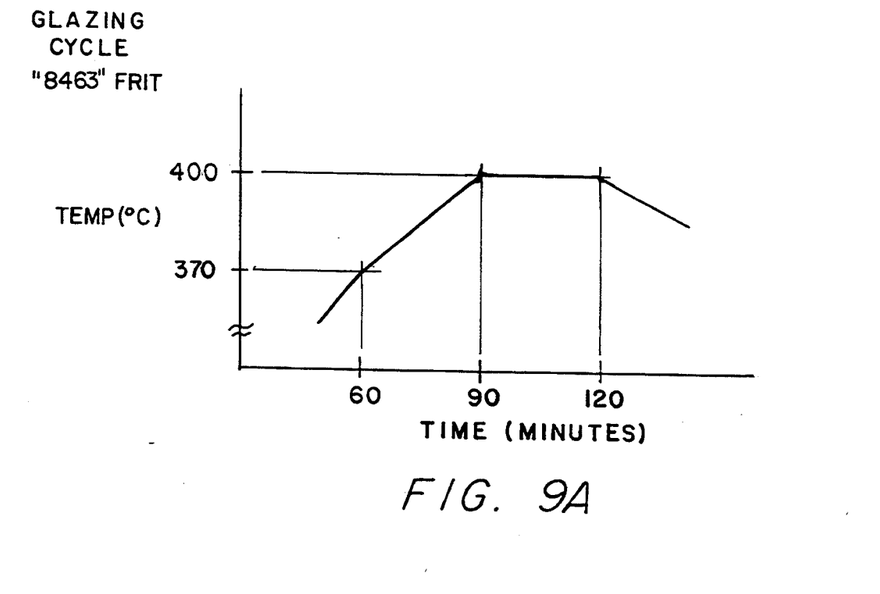
FIGS. 9A, 9B are graphs of temperature vs. time for a heating cycle to glaze and a heating cycle to seal the package with a vitrifying frit.

After the sealant material on the substrate cover 26 is dried, it is then heated in air within a chamber (not shown) at a temperature just above the softening point of the glass frit. This second heating cycle is used to "glaze" the glass frit on the substrate cover. That is, the glass frit powder is allowed to soften enough to cause the glass frit particles to flow together and to adhere to the substrate cover 26. Further, during this step, any additional remaining organic binder components in the glass frit are driven off. By providing the separate drying and glazing steps, it is believed that substantially all, if not all, of the binder vehicle components of the sealant material are driven off prior to final sealing of the package 20'. A glazing temperature profile such as shown in FIG. 8A for the devitrifying frit "7572" or a glazing temperature profile such as shown in FIG. 9A for the vitrifying frit "8463" is preferably used. For the vitrifying frit "8463", the general range for the glazing temperature is 380° C. to 435° C. The preferred temperature of 400° C. reduces the amount of bubbling and spread of the glass frit during the subsequent sealing operation. Similarly, for the devitrifying frit "7572" the temperature range for the glazing operation is from 340° C. to 380° C. At the preferred temperature of 360°, the amount of bubbling of the glass frit material was reduced and the spread of the glass frit material was also reduced during the subsequent sealing operation. During the glazing operation, after the cover 26 has been held at the final temperature for the prescribed period of time, the heat source for the chamber is turned off and the cover 26 is allowed to cool to substantially room temperature before being removed from the chamber.

Figure 3B:
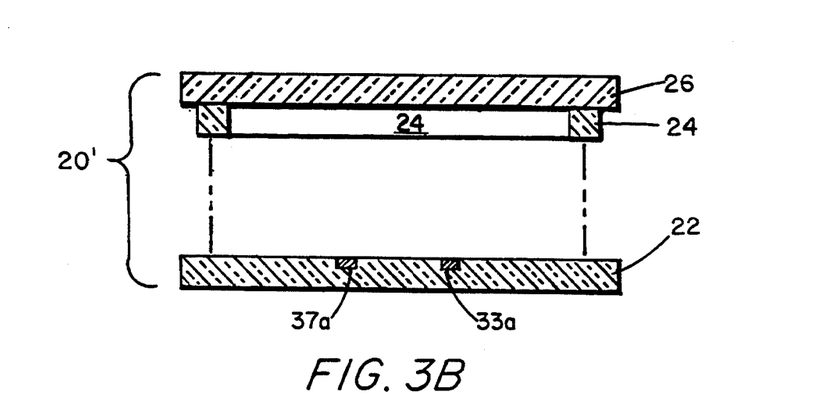
FIG. 3B is a cross-sectional view taken along lines 3B-3B of FIG. 3A showing the SAW device and the quartz cover having the patterned sealant material.

Referring now to FIGS. 3A, 3B, a package 20' for a SAW device, here the resonator 21a, is shown. The package 20' for such a device and for similar types of SAW devices such as a delay line (FIG. 4), filter, and the like are substantially the same except for the particular configuration of transducers and reflecting gratings as required. Therefore, fabrication of the package 20' for the resonator 21a (FIG. 3A) will here be described, however, such fabrication procedure will equally apply to fabricating other types of packaged SAW devices.

The SAW device package 20' for the resonator 21a is shown to include in addition to the processed substrate cover 26 as described in conjunction with FIGS. 2, 2A, the base substrate 22, here comprised of ST-cut quartz having a thickness here substantially equal to the thickness of the substrate cover 26, and having on a surface 22a a pair of transducers 34, 36. Here transducer 34 is used as an input transducer and transducer 36 is used as an output transducer. Each one of said transducers 34, 36 are comprised of interdigitated conductive members 32 and 35, respectively, which are coupled to corresponding ones of bus bar members 33a, 33b and 37a, 37b, as shown. Bus bar members and interdigitated conductive members are disposed in suitably provided grooves in the base substrate 22, as shown. By recessing the conductors, here of aluminum, in grooves provided in said substrate, unwanted sources of acoustic reflections are reduced, as is known in the art. Disposed between each one of a pair of edge portions of the base substrate 22 and each one of the pair of transducers 34, 36 is one of a pair of reflecting gratings 38a, 38b. Each reflecting grating 38a, 38b comprises a plurality of longitudinal grooves 39 provided in the base substrate 22. The surface 22a of base substrate 22 upon which the transducers are disposed supports propagation of surface waves thereon, such that an electrical signal introduced between bus bars 33a, 33b will launch surface waves in each direction along substrate 22. Surface waves launched towards the outer periphery of substrate 22 will be reflected at the reflecting grating 38a disposed on the substrate back toward transducer 34, as is known in the art, and the surface waves which propagate towards transducer 38 will be partially absorbed by transducer 38 inducing a corresponding voltage signal between bus bars 37a, 37b in transducer 38, with the remaining portion of said surface waves propagating toward and being reflected by reflecting grating 38b back towards transducer 36. The period of time between the reflected surface waves from gratings 38a and 38b determines the period of the waves and hence the frequency characteristics of the SAW resonator.

Figure 5A:
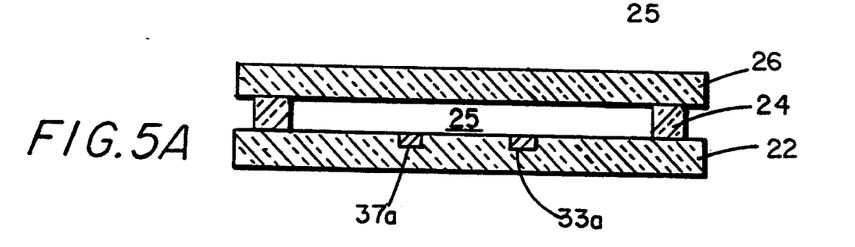
FIG. 5A is a cross-sectional view taken along lines 5A-5A of FIG. 5 of the sealed quartz package.
Figure 6:
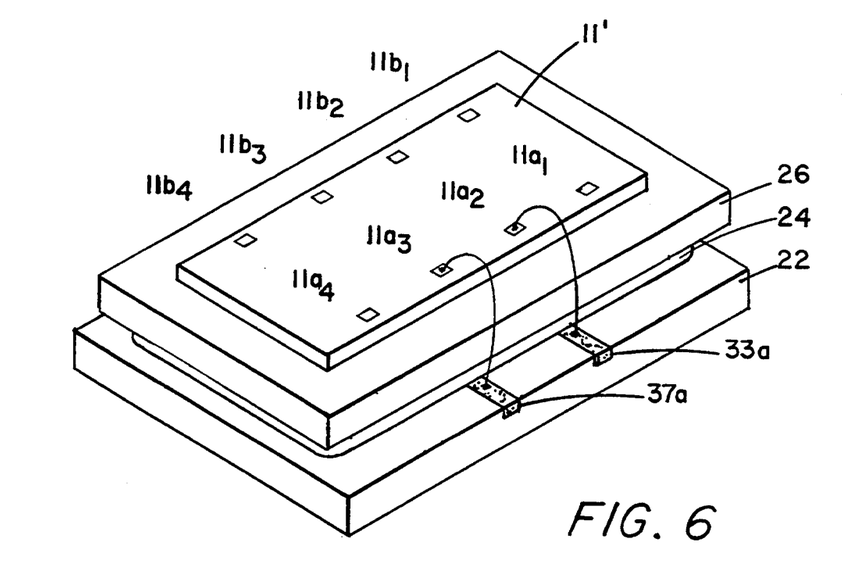
FIG. 6 is an isometric view of the packaged SAW resonator of FIG. 3A and having mounted on the cover portion of the package an integrated circuit having the electronic circuits which in combination with the SAW resonator provides the stable oscillator as shown in FIG. 1.

The substrate cover 26 having the glazed glass frit is mated to the substrate 22 to provide a seal 24 and the package 20' as shown in FIGS. 5, 5A and 6. The glass frit seal 24 in addition to providing a hermetic seal for the packaged SAW device also serves the purpose of a spacer to provide a space 24a (FIG. 5) between the opposing inner surfaces of the pair of substrates 22, 26. This space 24a permits the uninhibited propagation of surface waves along the surface of base substrate 22.

Figure 8B:
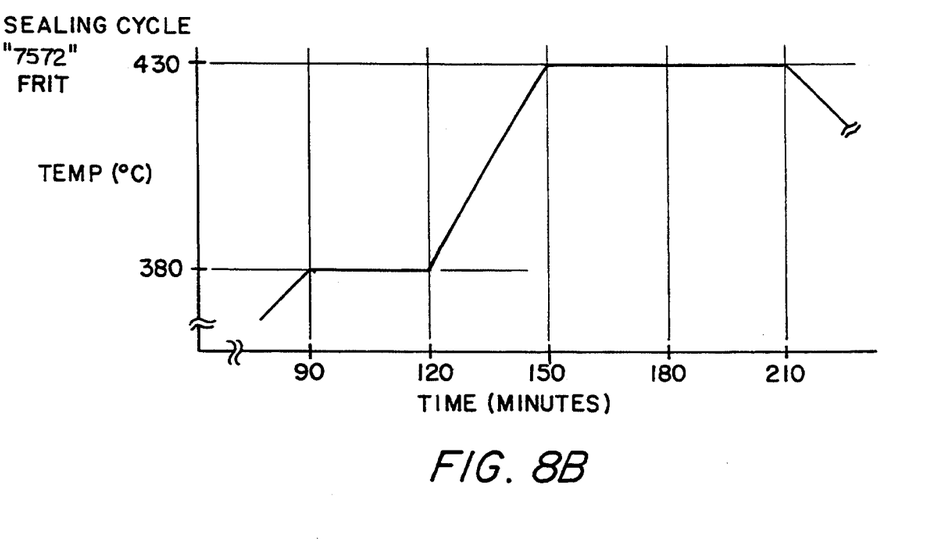
Figure 9B:
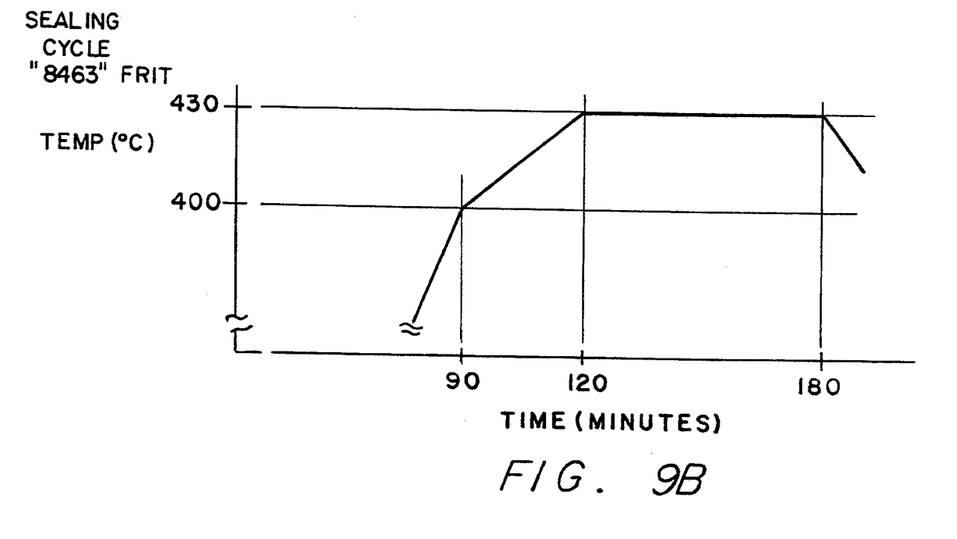

The substrate cover 26, having the patterned glazed glass frit as shown in FIG. 3A, is mated to the bottom cover or substrate of the SAW device 22 in the following manner. The base and cover members 22, 26 are mated together and are held in place by a suitable jig (not shown) which exerts a force upon the base substrate 22 and substrate cover 26 to hold said members 22, 26 together. The entire assembly including the jig is then heated in a chamber which provides a vacuum of typically from 1 torr to $10^{-6}$ torr, at a temperature above the glazing temperature of the glass frit, but below the crystallographic transformation temperature of the material of the substrates in order to cause the glass frit to reflow and wet both the quartz top cover 26 and the lower quartz substrate or base 22. A sealing temperature profile such as shown in FIG. 8B for the devitrifying frit "7572" or as shown in FIG. 9B for the vitrifying frit "8463" may be used. A maximum sealing temperature in the range of 410° C. to 470° C. for the devitrifying frit "7572" is preferably used with 430° C. being the preferred temperature, and a maximum sealing temperature in the range of 410° C. to 470° C. for the vitrifying frit "8463" is preferably used with 430° C. being the preferred temperature.

During the sealing operation, after the package 20' has been held at the final temperature for the prescribed period, the heat source in the chamber is turned-off and the chamber is allowed to cool to near ambient temperature before removing the sealed package 20'.

At this point, the sealed package 20' is provided as shown in FIGS. 5, 5A. The package 20' as shown in FIG. 5 includes pairs of exposed bus bars, here bus bars 33a and 33b, 37a and 37b, base substrate 22, glass frit seal 24 and substrate cover 26. Note that the width $W_{26}$ of the substrate cover 26 is selected to be smaller than the width $W_{22}$ of the base substrate 22, such that the bus bars 33a, 33b and 37a, 37b are exposed on the surface of the base substrate 22.

Referring now to FIG. 6, the packaged oscillator 10' is shown to include the composite SAW device package 20' having the lower, base substrate 22 and upper, substrate cover 26 spaced by the seal 24. Disposed on the outer, exposed surface of upper member 26 is an integrated circuit chip 11', here including the electronic circuit elements denoted by the dotted line 11 in FIG. 1. Integrated circuit 11' is here a conventional microelectronic integrated circuit having a plurality of bonding pads disposed on a first upper surface thereof, here bonding pads $11a_1$-$11a_4$ and $11b_1$-$11b_4$. As shown, bonding pads $11a_2$, $11a_3$ are shown electrically connected via wires 41a, 41b, respectively, to exposed bus bars 33a, 37a, respectively, of package 20', said bus bars being provided on base member 22. Bias signal leads and reference signal leads (not shown) are also connected to the integrated circuit chip in a conventional manner, as required.

Figure 7:
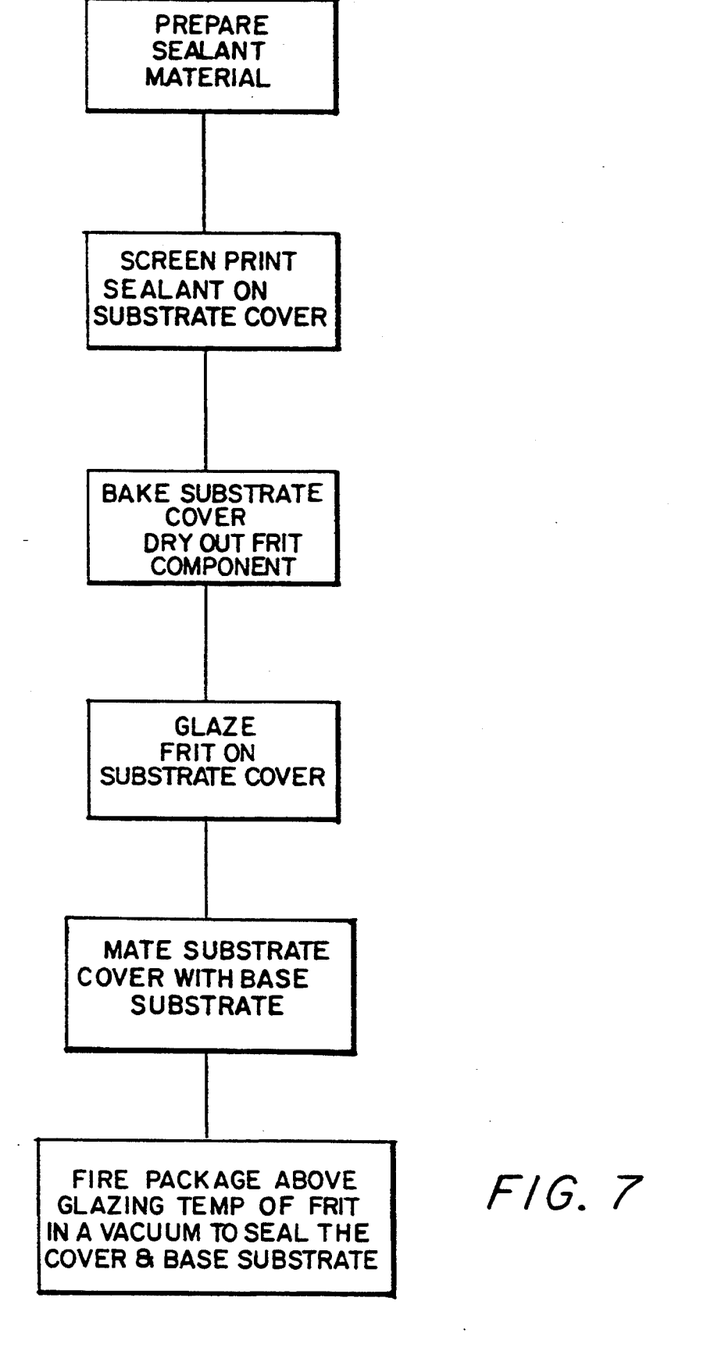
FIG. 7 is a flow chart showing the steps in providing the sealed quartz package in accordance with a preferred embodiment of the invention.

The flow chart of FIG. 7 summarizes the afore-mentioned steps in providing the SAW package 20'.

The packaged oscillator 10' having the glass frit seal may then be bonded to a suitable circuit board (not shown) disposed in a conventional package (not shown) and having on a portion of such circuit board a suitable soft material such as RTV silicone rubber or rubber (not shown). With the sealing arrangement just described, since package 20' is hermetically sealed in a clean vacuum environment and with the organic binder vehicle for the glass frit having previously been substantially, if not completely, driven from the glass frit prior to sealing, potential out-gassing problems caused by the binder vehicle are substantially eliminated. Further, the packaged sealed SAW device 20' now may be mounted on the RTV or rubber material without the problems which have been previously associated with out-gassing of the rubber or RTV material. Therefore, the long-term stability problems associated with conventional packages is eliminated.

When the SAW device is a resonator such as shown in FIG. 3A, substantially all of the acoustic wave energy is confined between the pair of reflecting gratings 38a, 38b. However, when the SAW device is a delay line 121 as shown in FIG. 4, for example, the acoustic energy is not confined. Thus, when the delay line is provided with a package 120 having base substrate 122, seal 124 and substrate cover 126, the energy will propagate out towards the glass frit seal 124 and be reflected from the seal 124 propagating back toward the transducers 134,136 and picked up by the transducers 134, 136 causing unwanted interference problems. Therefore, when fabricating a package 120 for such devices where acoustic energy is not confined, the glass frit pattern 52 of FIG. 2 in such cases is modified to the pattern 152 shown in FIG. 2B. A pair of opposing edges 152a, 152b of the glass frit pattern are disposed on a slant angle $\emptyset$ typically of 5° such that such pair of edges are not parallel with the plurality of fingers 132, 135 of the transducers 134, 136. With this modification, when the surface waves are reflected off the edges 124a, 124b of the seal 124, the direction of the wavefront which is reflected back will not be parallel to the fingers of the transducers 134, 136 and thus the transducers 134, 136 will not respond to the reflected wave. In all other aspects, fabrication of the package 120 is the same as package 20' described in conjunction with FIGS. 2-3 and 5-9.

Five examples of SAW resonators 21a were fabricated with the all quartz glass frit seal package 20'. Samples 3 and 4 were fabricated using the devitrifying frit "7572" and the remaining samples 1, 2 and 5 were fabricated using the vitrifying frit "8463." These packaged devices were measured for short term stability using the so-called single side band noise to carrier ratio $db_c/hz$ method and the ALLAN Variance method. The data for these measurements are summarized in Table 1 and Table 2, respectively. These measurements are generally used to characterize the noise levels of the SAW device. With noise levels less than 60 db for an offset frequency of 3.1623 Hz (SSB noise to carrier ratio method) and less than $34 \times 10^{-11}$ for 3.16 ms gate time (ALLAN Variance method) the SAW resonator 21a is a relatively low noise device. Thus, the presence of the seal 24 did not degrade the noise characteristic of the resonator 21a.

TABLE 1

| | SHORT TERM STABILITY 310 MHz RESONATORS | | | SSB NOISE TO CARRIER RATIO $dc_c/HZ$ 425 MHz RESONATORS | |
|---|---|---|---|---|---|
| OFF SET FREQUENCY | (1738) 1 | (1739) 2 | (1740) 3 | (1790) 4 | (1793) 5 |
| 1.0000 HZ | −44.7 ± 0.7 | −55.6 ± 1.3 | −47.4 ± 0.3 | −30.6 ± 1.3 | −40.8 ± 3.7 |
| 3.1623 HZ | −60.8 ± 1.7 | −69.0 ± 2.7 | −64.6 ± 1.3 | −49.4 ± 1.7 | −59.2 ± 2.3 |
| 10.0000 HZ | −74.3 ± 3.7 | −76.5 ± 2.9 | −77.5 ± 1.3 | −69.5 ± 2.3 | −75.8 ± 1.9 |
| 31.6228 HZ | −80.9 ± 1.3 | −84.9 ± 2.1 | −86.1 ± 1.5 | −78.3 ± 0.9 | −84.6 ± 0.6 |
| 100.0000 HZ | −90.4 ± 2.9 | −92.5 ± 0.6 | −93.6 ± 0.4 | −92.3 ± 2.0 | −94.3 ± 2.6 |

TABLE 2

| | SHORT TERM STABILITY 310 MHz RESONATORS | | | ALLAN VARIANCE $F/F (10^{-11})$ 425 MHz RESONATORS | |
|---|---|---|---|---|---|
| GATE TIME | 1 | 2 | 3 | 4 | 5 |
| 1.00 MSEC | 108 ± 6 | 64.8 ± 4.7 | 72.1 ± 3 | 47.8 ± 4.3 | 44.4 ± 5.3 |
| 3.16 MSEC | 34.6 ± 1.4 | 18.7 ± 1.4 | 19.9 ± 1.6 | 18.9 ± .79 | 16.0 ± .25 |
| 10.00 MSEC | 12.7 ± .83 | 7.10 ± .66 | 6.87 ± .59 | 13.5 ± 2.3 | 5.24 ± .20 |
| 31.62 MSEC | 5.29 ± .27 | 2.64 ± .15 | 3.32 ± .23 | 6.62 ± .93 | 3.24 ± .22 |
| 100.00 MSEC | 4.18 ± .27 | 1.36 ± .11 | 2.58 ± .24 | 7.69 ± 2.1 | 3.34 ± .57 |

Figure 10:
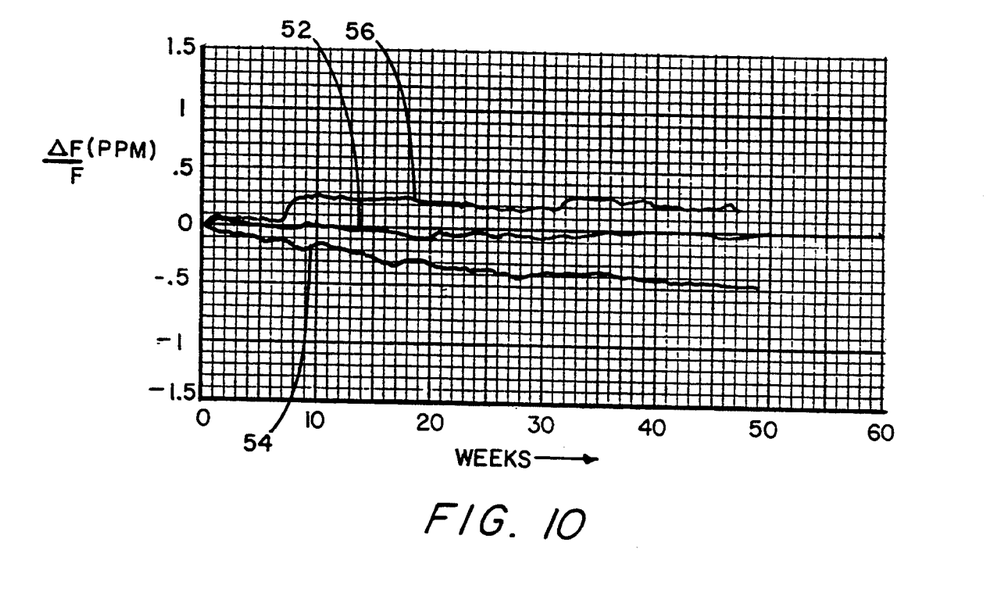
FIG. 10 is a graph of the fractional change in resonant frequency as a function of time for three packaged SAW resonators fabricated in accordance with the present invention.

Referring now to FIG. 10, long term stability data are shown plotted for three samples (samples 1-3, tables 1 and 2) of SAW resonators 21a having a center resonant frequency of around 310 MHz. As shown, curves 52, 54 and 56 for samples 1-3, respectively, long term stability of better than 0.4 ppm was provided from these samples with sample #2 showing long term stability of better than 0.1 ppm.

Figure 11:
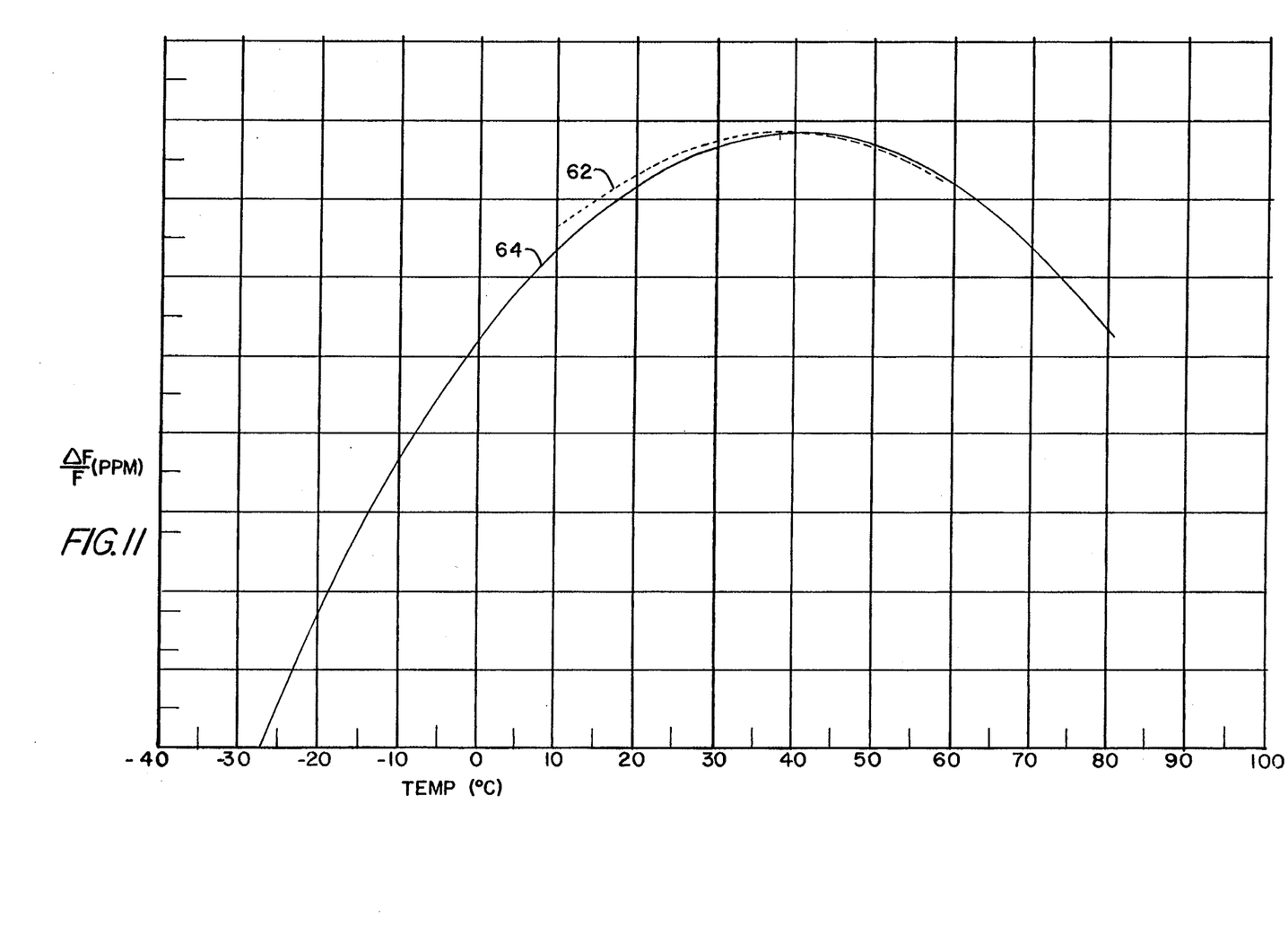
FIG. 11 is a graph of the fractional change in resonant frequency as a function of temperature for a SAW resonator fabricated on an ST-cut quartz substrate with a glass frit sealant and matching ST-cut quartz cover, and a SAW resonator fabricated on an ST-cut quartz substrate, with the glass frit sealant and matching ST-cut quartz cover used in an oscillator application, with the oscillator electronics mounted adjacent the SAW resonator.

Referring now to FIG. 11, typical frequency response vs. temperature curves (the frequency change ($\Delta F/F_o$) normalized to the center frequency in parts per million) for two SAW resonators, samples #3 and #4, are shown. The curve 62 for sample #3 taken over the temperature range of +10° C. to 60° C., includes the effect of the electronic components mounted within a chamber (not shown) adjacent the SAW device and used to provide in combination the oscillator. Curve 64 shows the frequency dependence for sample #4 only over the temperature range of −30° C. to +80° C. Both curves 62 and 64 have shapes which are characteristic of ST-cut quartz. Thus, the glass frit was not seen as changing in any significant manner the frequency vs.

temperature-characteristics of the ST-cut quartz substrate. It should be noted that the turnover temperatures 62', 64', that is, the temperature at which the curve is at a maximum d/dF ($\Delta$F/F)=0 was within 2.0° C. of the expected temperature for sample #3. Thus, the effect of the electronics of the oscillator mounted adjacent the SAW device in the chamber did not change in any significant manner the temperature/frequency characteristic of the SAW oscillator, sample #3, from a typical characteristic of an ST-cut quartz substrate.

Leak rate testing was also performed on three seal quartz packages as shown in Table III. The tested packages were not provided with transducers because of the destructive nature of the testing. Glaze and seal temperatures are given for the end bake or plateau temperatures of the profiles shown in FIGS. 8A, 8B, 9A, 9B. It is noted that $4.1 \times 10^{-9}$ cc/min is the lowest leak rate which can be detected with the leak rate equipment used. It is not clear, therefore, whether this rate was actually detected.

TABLE

| | | LEAK RATE DATA | | |
| --- | --- | --- | --- | --- |
| Sample | Frit Type | Glaze Temp. °C. | Seal Temp. °C. | Leak Rate $\times 10^{-9}$ cc/min |
| 6 | 7572 | 360 | 430 | <4.10 |
| 7 | 8463 | 400 | 430 | <4.10 |
| 8 | 8463 | 400 | 430 | <4.10 |

Having described a preferred embodiment of the invention, it will now be apparent to one of skill in the art that other embodiments incorporating its concept may be used. It is felt, therefore, that this invention should not be restricted to the disclosed embodiment, but rather should be limited only by the spirit and scope of the appended claims.

What is claimed is:

1. A surface wave device comprising:
   a base comprised of a crystalline material having a surface which supports surface wave propagation;
   a pair of transducers, each comprising a corresponding plurality of conductive members disposed on said surface of said base;
   a cover comprising a crystalline material; and
   a glass frit disposed completely around peripheral surface portions of said cover and base to provide a continuous closed ring layer between said cover and base.

2. The surface wave device as recited in claim 1 wherein the material of said base and cover are crystallographically matched.

3. An oscillator comprising:
   a surface wave delay line comprising:
   (i) a base comprising a crystalline material having a surface which supports surface wave propagation and a pair of transducers coupled to said surface wave propagation surface;
   (ii) a cover comprising a crystalline material;
   (iii) a glass frit disposed completely around peripheral surface portions of said base and cover to provide a continuous closed ring layer between said cover and base;
   means, including an amplifier mounted on an outer surface of said cover, for providing in combination with the delay line the oscillator.

4. The surface wave device of claim 2 wherein said base and cover are ST cut or rotated ST cuts of quartz.

5. The surface wave device of claim 4 wherein said glass frit is further disposed in a closed rectangular ring pattern between said base and cover peripheral surface portions.

6. The surface wave device of claim 5 wherein said single layer of glass frit is a devitrifying glass frit.

7. The surface wave device of claim 6 wherein said glass frit is Corning Glass Works types '7572'.

8. The surface wave device of claim 5 wherein said single layer of glass frit is a vitrifying glass frit.

9. The surface wave device of claim 8 wherein said glass frit is Corning Glass Works type '8463'.

10. The surface wave device of claim 4 wherein said glass frit is further disposed in a closed ring pattern having a pair of opposing straight edges thereof, not parallel to the acoustic aperture formed by said pair of transducers.

11. The surface wave device of claim 10 wherein said single layer of glass frit is a devitrifying glass frit.

12. The surface wave device of claim 11 wherein said glass frit is Corning Glass Works types '7572'.

13. The surface wave device of claim 10 wherein said single layer of glass frit is a vitrifying glass frit.

14. The surface wave device of claim 11 wherein said glass frit is Corning Glass Works type '8463'.

15. The oscillator of claim 3 wherein said glass frit is further disposed in a closed rectangular ring pattern between said base and cover peripheral surface portions.

16. The oscillator of claim 15 wherein said glass frit is Corning Glass Works type '7572'.

17. The oscillator of claim 15 wherein said glass frit is Corning Glass Works type '8463'.

18. The oscillator of claim 3 wherein said glass frit is further disposed in a closed ring pattern having a pair of opposing straight edges thereof, not parallel to the acoustic aperature formed by said pair of transducer.

19. The oscillator of claim 18 wherein said glass frit is Corning Glass Works type '7572'.

20. The oscillator of claim 19 wherein said glass frit is Corning Glass Works type '8463'.

* * * * *